United States Patent
Minichetti

(10) Patent No.: US 9,762,176 B2
(45) Date of Patent: Sep. 12, 2017

(54) HYBRID PHOTOVOLTAIC AND PIEZOELECTRIC FIBER

(71) Applicant: Maxmillian Minichetti, Greenwich, CT (US)

(72) Inventor: Maxmillian Minichetti, Greenwich, CT (US)

(*) Notice: Subject to any disclaimer, the term of this patent is extended or adjusted under 35 U.S.C. 154(b) by 317 days.

(21) Appl. No.: 14/799,538

(22) Filed: Jul. 14, 2015

(65) Prior Publication Data

US 2017/0019054 A1    Jan. 19, 2017

(51) Int. Cl.
| | |
|---|---|
| *H01L 41/113* | (2006.01) |
| *H02N 2/18* | (2006.01) |
| *H02S 10/10* | (2014.01) |
| *H01L 31/0352* | (2006.01) |
| *H01L 31/0392* | (2006.01) |
| *H01L 41/08* | (2006.01) |
| *H01L 41/18* | (2006.01) |
| *H01L 41/37* | (2013.01) |

(52) U.S. Cl.
CPC .......... *H02S 10/10* (2014.12); *H01L 31/0392* (2013.01); *H01L 31/035281* (2013.01); *H01L 41/082* (2013.01); *H01L 41/113* (2013.01); *H01L 41/183* (2013.01); *H02N 2/18* (2013.01); *H01L 41/37* (2013.01)

(58) Field of Classification Search
CPC ... H01L 41/113; H01L 41/082; H01L 41/183; H02N 2/18; H02S 10/10
USPC .......................................................... 310/339
See application file for complete search history.

(56) References Cited

U.S. PATENT DOCUMENTS

| | | | | |
|---|---|---|---|---|
| 2010/0326503 | A1* | 12/2010 | Wang ..................... | H01G 9/20 136/255 |
| 2013/0162192 | A1* | 6/2013 | Park ........................ | H02J 7/32 320/101 |
| 2013/0257156 | A1* | 10/2013 | Hadimani ............. | H01L 27/301 307/48 |

* cited by examiner

*Primary Examiner* — Derek Rosenau
(74) *Attorney, Agent, or Firm* — Cittone & Chinta LLP; James P. Demers

(57) ABSTRACT

The invention provides hybrid photovoltaic-piezoelectric energy harvesting devices in the form of flexible filaments. The devices harvest energy from ambient light, and also from environmental motions and vibrations. They are particularly suitable for incorporation into fabrics and clothing.

20 Claims, 16 Drawing Sheets

HYBRID PHOTOVOLTAIC AND PIEZOELECTRIC FIBER

RELATED APPLICATIONS

There are no related or priority applications.

FIELD OF THE INVENTION

This invention relates to dual photovoltaic-piezoelectric devices.

BACKGROUND

The rigid nature of inorganic semiconducting substrates confines the application of solar cells based on such semiconductors to flat surfaces. Bulk heterojunction (BHJ) organic photovoltaic cells (OPVCs), which are flexible, have the potential to supplant such devices, at least for installation on flexible and/or non-planar surfaces, but such flexible solar cell devices are seldom comparable in durability or efficiency to their rigid counterparts. Consequently, the optimization of flexible device stability and power conversion efficiency (PCE) are the objects of considerable current research.

High-power piezoelectric nanogenerators (PNGs) have been extensively studied in recent years, and constitute an emerging technology. These devices are typically fabricated from rigid ceramic materials, such as bismuth ferrite ($BiFeO_3$, "BFO") (D. Lee, T. W. Noh, *Phil. Trans. R. Soc. A* (2012) 370:4944-4957). Lead zirconate titanate (Pb$[Zr_xTi_{1-x}]O_3$, "PZT") is another promising candidate with a very high piezoelectric coefficient, which has recently been formed into flexible devices on plastic substrates (K.-I. Park et al., *Adv. Mater.* (2014), 26:2514-2520.) Flexible piezoelectric architectures are attracting attention for their practicality, and for the potential to match or exceed their rigid counterparts in conversion efficiency.

Hybrid photovoltaic/piezoelectric energy-harvesting filaments could be woven into textiles or integrated directly within clothing to provide adaptable, portable, and autonomous electricity from both human locomotion and solar radiation. Wind power could be harvested from sails, flags, and highway and advertising signage. Large-scale devices could serve as overhead power lines capable of harvesting energy from solar radiation and from mechanical strain induced by rain and wind. The devices, either alone or serving as trickle chargers for batteries, could power a variety of commercial and biomedical electronics such as cellular phones, prostheses, pacemakers, and hearing aids. The versatility of this technology promises additional applications in automotive, military, robotics, aerospace, and other fields, but the limitations on rigid structures, noted above, are an impediment to advances in the field. Accordingly, there is an ongoing need for such hybrid devices having increased flexibility and improved efficiencies and operating lifetimes.

SUMMARY OF THE INVENTION

The present invention provides devices having a filamentous architecture, which have a useful degree of flexibility and feature improved dual photovoltaic and piezoelectric energy-harvesting capabilities. It is an object of the invention to provide such devices with long operational lifetimes.

The hybrid piezoelectric-photovoltaic fibers of the invention comprise a metallic wire core, with a plurality of piezoelectric nanowires attached to the surface of the wire. The piezoelectric nanowires are embedded within a piezoelectric polymer sheath that encloses the wire core. An organic photovoltaic sheath encloses the piezoelectric polymer sheath.

The metallic wire core may be any conducting metal, and is preferably a copper or silver wire, more preferably copper. The piezoelectric polymer sheath is preferably β-phase PVDF (polyvinylidene difluoride), or a copolymer thereof such as P(VDF-TrFE) (polyvinylidene difluoride trifluoroethylene copolymer.) Suitable piezoelectric polymers are known in the art, for example those described by K. S. Ramadan et al., *Smart Mater. Struct.* (2014), 23(3) 033001.

The photovoltaic sheath comprises concentric layers of (a) an optional elastomer base, (b) a hole transport layer, and (c) an active photoelectric layer. The photovoltaic sheath is preferably covered by a TiOx transport layer, and optionally by an outer elastomer layer as well. The elastomer base and outer layers may be any elastomer known to the art to be useful as a moisture barrier, including but not limited to polyolefins, polyurethanes and silicones. In a preferred embodiment, the elastomer comprises polydimethylsiloxane (PDMS).

The anode (hole transport) layer may be any hole transport material known in the art of organic photovoltaic materials, including but not limited to organic anode interfacial layers such as TPDSi2:TFB and PEDOT:PSS.

The active photoelectric layer may be any of the organic active photoelectric materials known in the art. An active photoelectric is a material that generates an exciton pair upon absorption of a photon, and which enables and/or permits separation of the resulting charge carriers (typically an electron and a hole). Preferred materials are phase-separated blends of electron donor and electron acceptor polymers (bulk heterojunctions) such as P3HT/$PC_{61}BM$, PTB7:$PC_{61}BM$, F8T2:$PC_{61}BM$ and PCDTBT:$PC_{70}BM$. The light-harvesting efficiency of the bulk heterojunction may be enhanced by additives such as colloidal quantum dots (QDs), multiwall carbon nanotubes (MWCNTs) and silver nanoparticles (AgNPs).

The photoelectric sheath may further comprise a hole extraction layer (HEL) such as molybdenum oxide ($MoO_x$), vanadium oxide ($V_2O_5$) or graphene oxide; a preferred HEL is graphene oxide. Transparent conducting oxides, such as ITO (Sn-doped $In_2O_3$) and CIO (In-doped CdO), may be applied as conductive anode and cathode layers.

The photoelectric sheath preferably comprises a TiOx outer conductive layer. Alternatively, the order of layers in the photovoltaic sheath may be reversed, leading to an "inverted" device geometry in which electrons are collected by the bottom (inner) electrode and holes are collected by the top (outer) electrode. The inverted geometry allows the use of a high work function, air-stable outer metal electrode, such as silver or gold.

In an illustrative embodiment of the invention, organic photovoltaic-piezoelectric nanogenerator (OPV-PNG) fibers were engineered by optimizing a film-type PCDTBT:$PC_{70}BM$ organic solar cell for application onto the exterior of a similarly optimized ZnO nanowire/PVDF composite piezoelectric filament core. These representative filamentous OPV architectures produced ~590 mV after PDMS thin film encapsulation, exhibiting only a 0-6% decrease in voltage output after 240 hours of storage in air. The OPV-PNG devices of the invention, when integrated within a cotton textile, produced ca. 1.14 V and ca. 310 mV from the OPVC and PNG components, respectively.

DETAILED DESCRIPTION OF THE INVENTION

The invention provides hybrid piezoelectric-photovoltaic energy harvesting filaments, which comprise a conductive core, zinc oxide nanowires extending radially outward from the core, and a piezoelectric polymer matrix encasing the core and filling the space between the nanowires. Encasing the piezoelectric polymer matrix is a series of concentric, cylindrical layers that together constitute an organic photovoltaic cell. In alternative embodiments, the conductive core may have an elongated cross-section, such as in a ribbon, and the piezoelectric and/or photovoltaic layers may be non-cylindrical as well.

The conductive core is preferably a metal, more preferably silver or copper, and is preferably in the form of a wire. The piezoelectric polymer is preferably polyvinylidine difluoride (PVDF). In a preferred embodiment, the concentric layers that constitute the organic photovoltaic cell are, in order from the innermost to outermost layers, polydimethylsiloxane (PDMS), an organic hole transport layer, an organic bulk heterojunction layer, and a clear electrode layer. In preferred embodiments, the organic hole transport layer is PEDOT:PSS. The bulk heterojunction (BHJ) is preferably a phase-separated blend of PCDTBT and $PC_{70}BM$. The clear electrode layer is preferably TiOx. In certain embodiments, a hole extraction layer is interposed between the PDMS and the hole transport layer. The hole extraction layer is preferably graphene oxide. In certain preferred embodiments, the entire filament is encased within a layer of transparent polymer, which may for example be PDMS.

Figure 4:
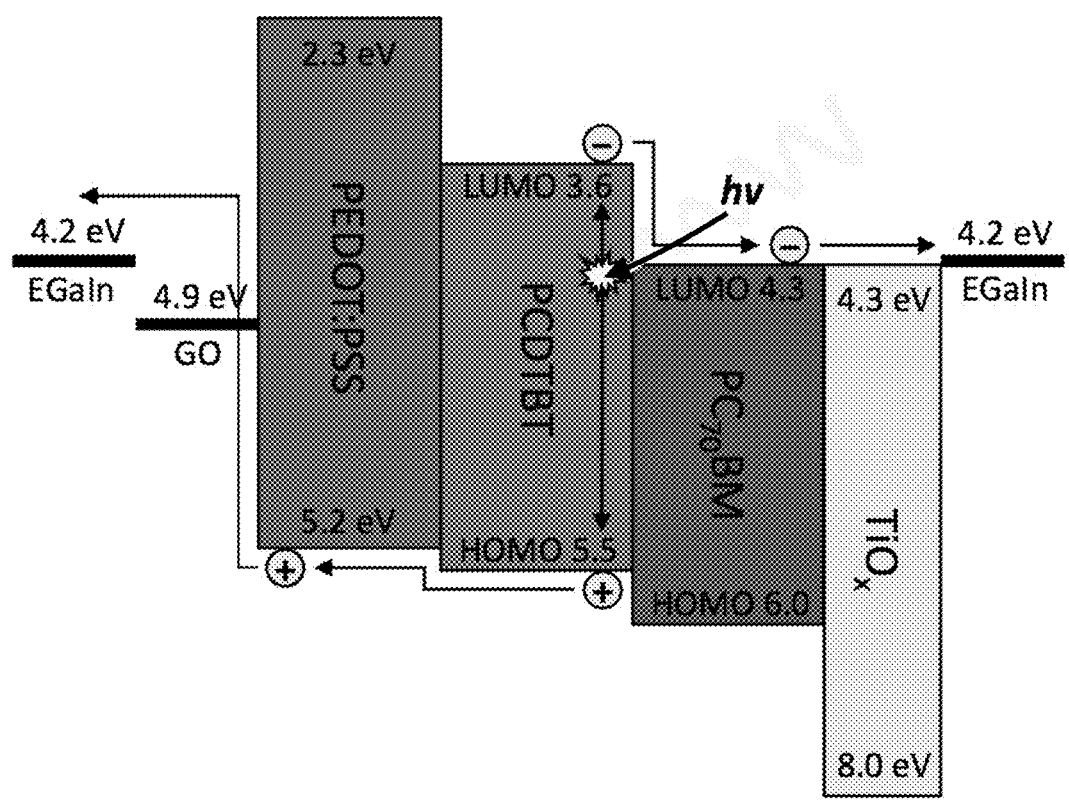
FIG. 4 is an illustration of light-induced charge migration through the layers of a OPV-PNG fiber of the invention.

The generation and transport of charge carriers in an exemplary flexible OPVC architecture of the invention is illustrated in FIG. 4. Upon absorption of a photon, an electron located in the Highest Occupied Molecular Orbital (HOMO) of PCDTBT is promoted to the Lowest Unoccupied Molecular Orbital (LUMO) of the PCDTBT donor material, creating an exciton (bound electron-hole pair). The exciton then diffuses to the interface between the PCDTBT polymer donor phase and $PC_{70}BM$ fullerene acceptor phase, where it dissociates into electron and hole charge carriers. The separated carriers then diffuse to the electrodes at opposite ends of the solar cell, flow through an external load, and do work.

The devices of the invention also comprise contacts 8a-8d in electrically conductive communication with the wire core 1, the piezoelectric polymer 3, hole transport layer 5 or hole extraction layer 5, and the outermost conductive layer 7, respectively. In operation, irradiation of the device of the invention with visible light generates a voltage, and mechanical bending or compression of the device generates a piezoelectric voltage that is positively additive to the photogenerated voltage.

Flexible OPVCs were successfully optimized, by the methods described herein, to produce a voltage of 725 mV and current density of 11.2 mA/cm$^2$ at a fill factor of 0.56 and power conversion efficiency (PCE) of 4.58%. In comparison to unoptimized devices, the devices of the present invention exhibit a 49% increase in voltage, an 88% increase in current density, and a 160% increase in PCE. Fully-flexible OPV cells were comparable in performance to conventional, rigid devices, being only 1.8% lower in PCE, 3.4% lower in current density, and 7.2% lower in voltage.

The filamentous PNGs of the invention generated 143.6 mV, demonstrating a 61% increase in voltage performance. The prior art gold seed layers for nanowire growth (M. Lee et al., *Adv. Materials* (2012) 24:1-6) were successfully replaced with cost-effective zinc oxide seed layers, exhibiting improved conversion efficiencies. Further experimentation with PVDF layer thickness and zinc oxide nanowire growth enhanced power outputs. PVDF layers of optimal thickness (ca. 50 μm) were given a high β-phase content via thermal annealing, which proved to be persistent on cooling. Surprisingly, high-voltage poling, considered by the prior art to be crucial for alignment of the ZnO and PVDF dipoles, was discovered to be unnecessary. PVDF films of the invention, less than 100 μm in thickness, exhibited the desired piezoelectric energy-harvesting properties without a high voltage poling process. The present invention is not bound by theory, but it is believed that the ZnO nanowires induce the necessary alignment during the annealing process.

Filamentous OPV-PNG devices of the invention were successfully engineered and integrated within cotton textiles, producing approximately 1.14 V and 310 mV from their OPVC and PNG components, respectively. Individual filamentous OPVC architectures produced approximately 590 mV after PDMS thin film encapsulation and displayed a measurable increase in stability. Individual PNG cores consistently generated comparable voltages, ranging between 130 and 170 mV, and showed no instability with age.

Hybrid energy-harvesting filamentous architectures were successfully engineered through facile and practical fabrication procedures. Such devices exhibited competitive power generation and performance stability while maintaining high flexibility, thicknesses below 0.65 mm, and practical applicability as wearable photovoltaic-piezoelectric nano generators.

PNGs were fabricated with cost-effective materials and facile methods. Zinc oxide nanowires were grown under low temperature aqueous chemical growth conditions and optimized in piezoelectric efficiency according to growth duration. A zinc oxide seed layer effectively supplanted the work of previous literature, which utilized a thermally evaporated gold seed layer to initiate nanowire growth. Finally, due to the optimal thickness of PVDF (50 μm), β-phase content was successfully achieved and maintained over time without the use of high-voltage poling.

EXAMPLES

1. PNG Devices
   (a) Materials

Chemicals were commercially available, reagent or electronic grade materials. Deionized water was used throughout. Copper filament for device cores was AWG 37 gauge (ca. 0.1 mm), pulled from 15-strand wire and used without surface preparation.

(b) PNG Device Fabrication

Figure 1:
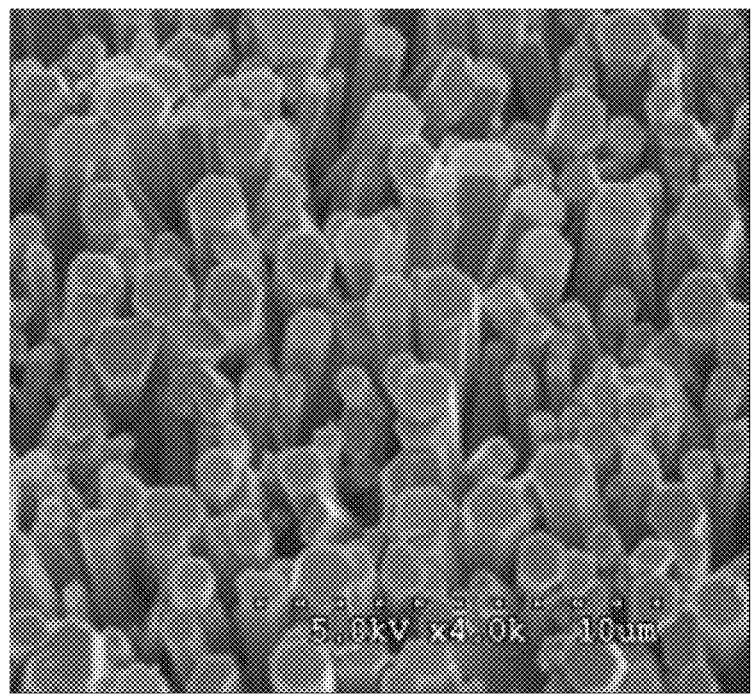
FIG. 1 is a SEM microphotograph of a zinc oxide nanowire array of the invention.

Fiber-type PNGs (M. Lee et al., *Adv. Materials* (2012) 24:1-6) were fabricated on thin copper core filaments provided with a deposited zinc oxide seed layer, on which the aqueous chemical (hydrothermal) growth of zinc oxide nanowires was carried out. (A. Sugunan et al., *J. Sol-Gel Sci. Techn.* (2006), 39:49-56.) The zinc oxide seed layer solution was prepared by dissolving zinc acetate dihydrate in anhydrous ethanol at a concentration of 5 mM, stirring for 30 minutes until a clear solution was obtained. Copper filaments were dip-coated in the zinc oxide seed layer solution (5 times) and annealed at 250° C. for 20 minutes; this process was then repeated a second time. (L. E. Greene et al., *Nano Lett.* (2005), 5:1231-1236.) The intermediate copper core filament was subsequently immersed in a zinc oxide nanowire nutrient solution consisting of 25 mM hexamethylenetetramine (HMTA) and 25 mM zinc nitrate in deionized water. Nanowires were grown at 85° C. in an isothermal oven for 20 hours, and the wires were then rinsed and dried in vacuo. A scanning electron microscopy (SEM) image of the resulting zinc oxide nanowire array is shown in FIG. 1.

Figure 2:
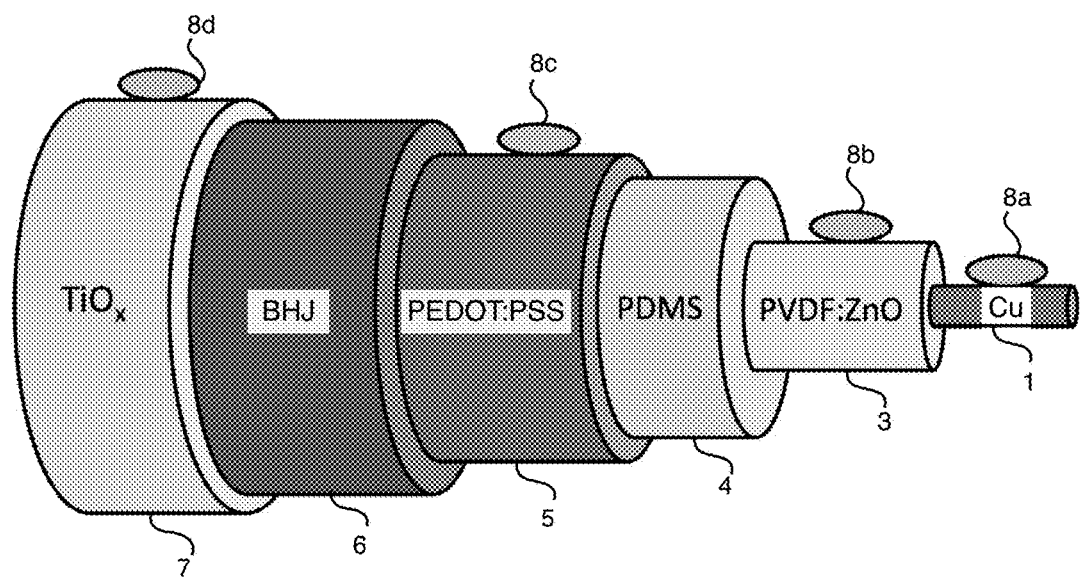
FIG. 2 is a schematic perspective, cutaway view of a hybrid OPV-PNG fiber of the invention.

The dried wire was dipped into a solution of poly(vinylidene fluoride) (PVDF) powder (1.5 g) in acetone-DMF (6:4 v/v, 20 ml)), and the device was then annealed at 90° C. for 30 minutes to increase β-phase PVDF content. To build up thicker layers of PVDF, these intermediate devices were then dipped in the PVDF solution, removed at a steady, approximate speed of 5 mm/s to ensure uniformity, and again annealed; this was repeated until the desired PVDF thickness was reached. A schematic of the resulting PNG device is illustrated in FIG. 2 (a perspective drawing) and FIG. 3 (a cross section.) These drawings are illustrative and are not to scale.

Figure 3:
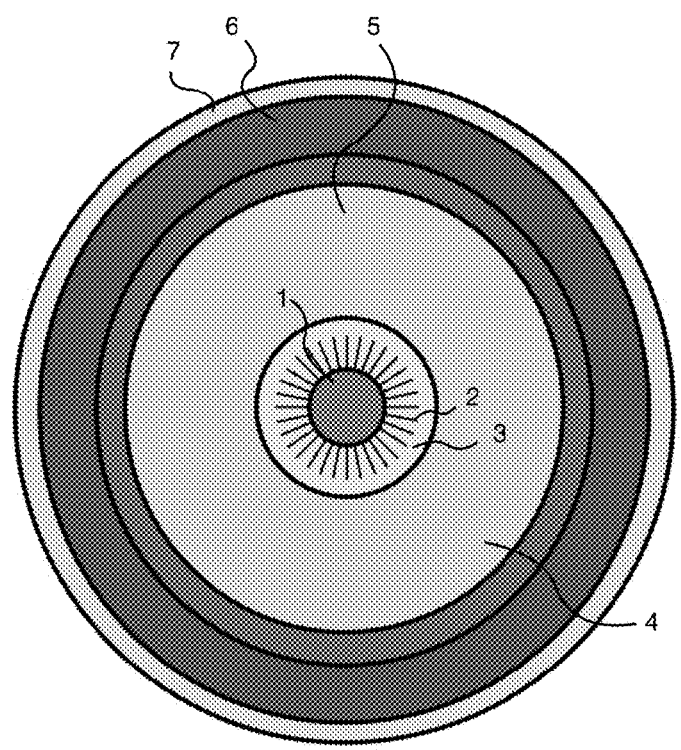
FIG. 3 is a schematic cross sectional view of a hybrid OPV-PNG fiber of the invention.

FIGS. 2 and 3 show the copper wire core conductor 1, surrounded by the PVDF sheath 2 with embedded ZnO nanowires 3. Surrounding this is the PDMS base layer 4 of the photovoltaic sheath. Layered onto the PDMS, after an ozone surface treatment, is the Hole Transport Layer 5, in this example made from PEDOT:PSS. Layered onto the HTL is the active photovoltaic layer 6, in this case a bulk heterojunction (BHJ) material. Finally, a protective outer layer 7 of TIOx is present. Electrodes 8a-8d are provided for drawing off the current generated by the device; these may be metal or transparent metal oxide (TMO) materials such as ITO (Sn-doped $In_2O_3$) and CIO (In-doped CdO). EGaIn (eutectic gallium indium) is used in the examples herein, as a convenient means of attaching instruments.

Figure 5:
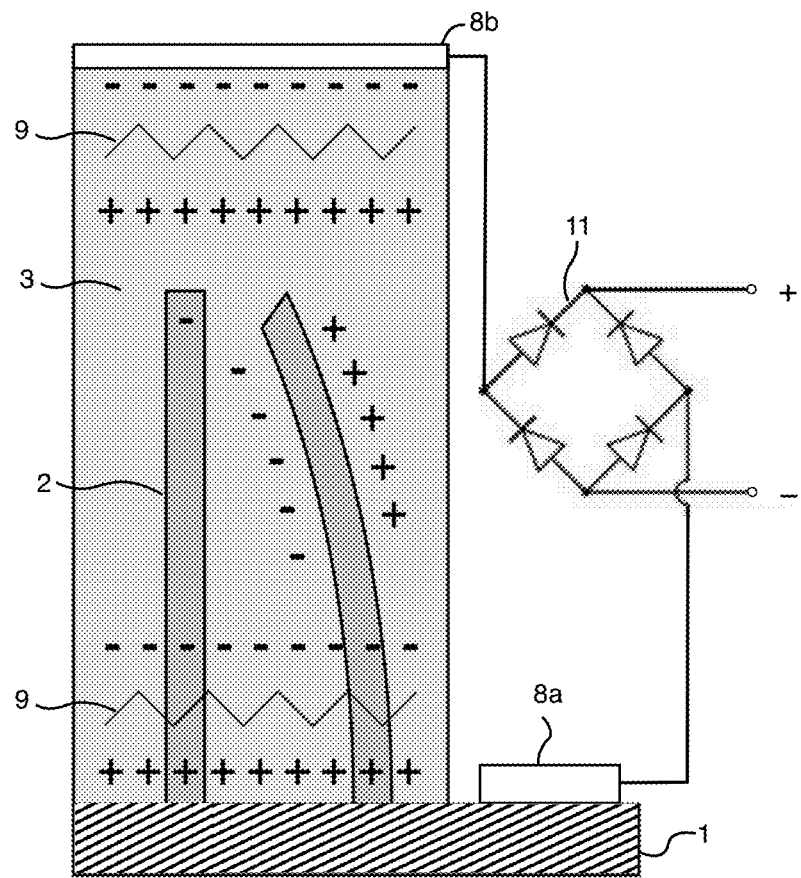
FIG. 5 is an illustration of the charge separation induced in a PVDF matrix by the bending of a zinc oxide nanowire.
Figure 6:
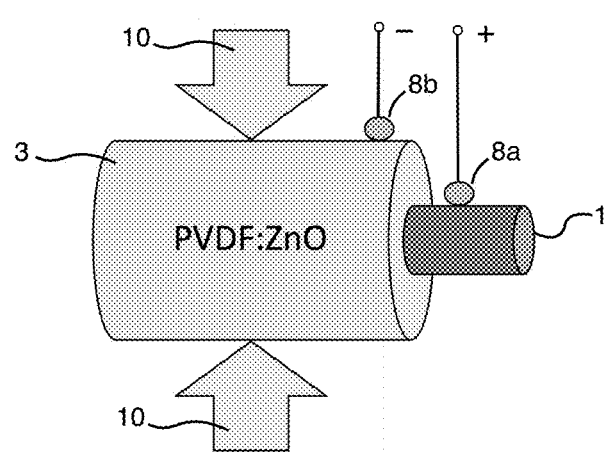
FIG. 6 is an illustration of charge separation induced by radial stress applied to the PVDF matrix.

As shown schematically in FIGS. 5 and 6, upon the application of a mechanical stress 10 to these PNG devices, fluorine atoms in β-phase PVDF chains 9 take a negative charge while hydrogen atoms assume a positive charge. A charge separation also develops on the stressed ZnO nanowires 2, with axial compression creating a substantial charge separation along the axis of the nanowire. The effects are additive, as shown schematically in FIG. 6. (Bending of the nanowires creates a smaller charge separation across the width of the nanowire.) Release of compression causes an opposite flow of charge. Cyclic application of a compressive force 10, therefore, leads to an alternating current flow, which can be converted, if necessary, into a DC output with a rectifying bridge 11 as shown in FIG. 5.

(c) PNG Device Characterization and Optimization

EGaIn (eutectic gallium indium, 75.5% Ga, 24.5% In) contacts were placed on the outer PVDF layer and on an exposed section of the copper core filament. The PNG devices were placed between 1"×1" glass slides to equalize the applied force across the piezoelectric filament. Cyclic stressing produced an AC output, which was converted to DC prior to measurement by passage through a diode bridge rectifier. Piezoelectric measurements were conducted for 20-second durations to investigate the reproducibility and reliability of device voltage responses to repetitive impacts of up to 20 N. To optimize PNG efficiency, output voltage was measured as a function of applied force for a variety of device architectures, as described below.

(d) Alternative Seed Layers for Nanowire Growth

Figure 7:
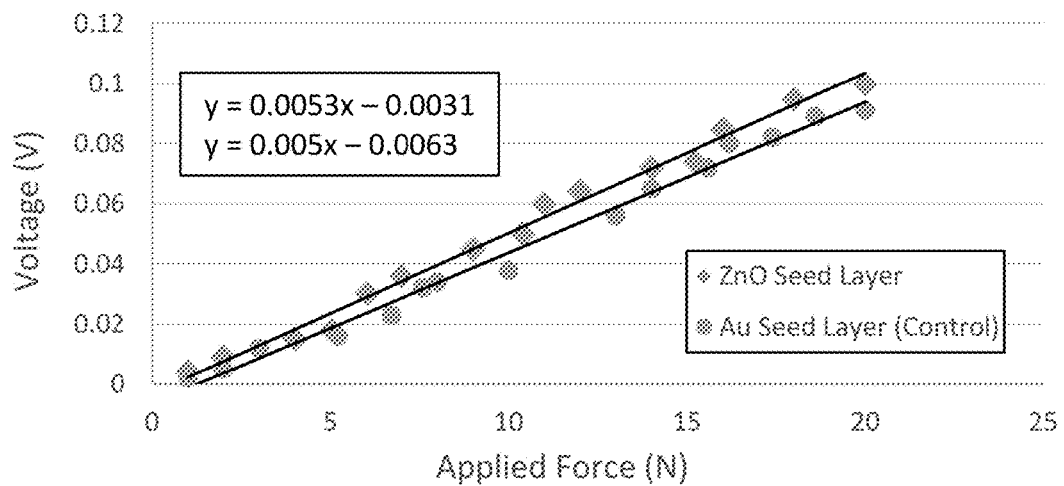
FIG. 7 is a comparison of the performance of PNG fibers prepared with ZnO and gold seed layers.

Cost-effective zinc oxide seed layers exhibited higher voltage outputs, relative to control seed layers deposited with a 25 mg/ml gold plating solution. The slope and y-intercept of linear trend lines were comparatively analyzed to numerically differentiate PNG conversion efficiencies. As shown in FIG. 7, devices constructed with zinc oxide seed layers exhibited a y-intercept of −0.0031 V and a slope of 0.0053 V/N, while devices constructed with gold seed layers demonstrated a smaller y-intercept of −0.0063 V and a lower slope of 0.005 V/N.

(e) Zinc Oxide Nanowire Length

Figure 8:
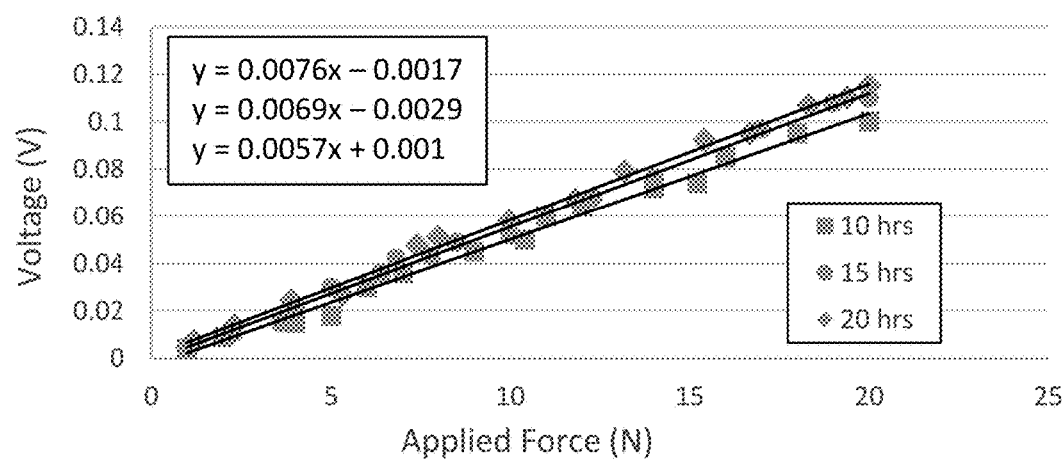
FIG. 8 is a comparison of the performance of PNG fibers prepared with varying ZnO nanowire growth times.

PNGs having varying zinc oxide nanowire lengths demonstrated comparable voltages after 10 hours or more of growth. Efficiencies were highest for 20 hour periods, presumably due to longer zinc oxide nanowires and larger surface areas for charge carrier generation under mechanical stress. The slope and y-intercept of linear trend lines were compared for devices of variable nanowire growth durations. As shown in FIG. 8, PNGs subject to 20 hours of nanowire growth demonstrated a y-intercept of −0.0017 V and a slope of 0.0076 V/N, while devices subject to 15 hours of growth exhibited a smaller y-intercept of −0.0029 V and a lower slope of 0.0069 V/N. PNGs constructed with less than 10 hours of nanowire growth demonstrated the lowest efficiencies with the smallest linear slopes (data not shown.)

(f) Thickness of PVDF Layers

Figure 9:
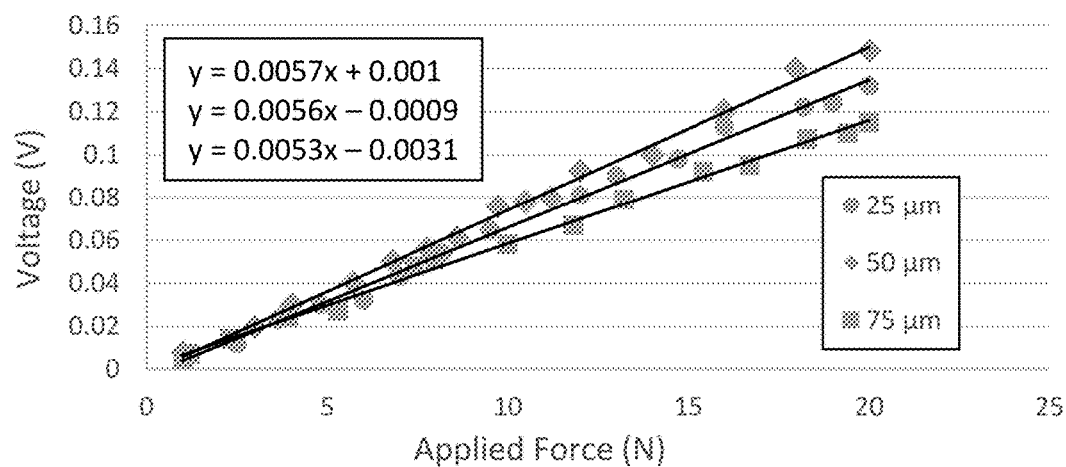
FIG. 9 is a comparison of the performance of PNG fibers prepared with varying thicknesses of the PVDF layer.

Devices of varying PVDF layer thicknesses, as approximated by SEM, were compared. PNGs engineered with PVDF layers of 50 μm provided optimal results. PVDF films with thicknesses less than 100 μm demonstrated and maintained piezoelectric properties without the necessity of high voltage poling, making the optimal 50 μm PVDF thickness especially attractive for practical device fabrication. As shown in FIG. 9, devices constructed with 50 μm PVDF layers exhibited the highest slope and y-intercept (0.0057 V/N and 0.001 V, respectively.) Devices constructed with 25 μm PVDF layers were less efficient, most likely due to defects in layer integrity and uniformity over the zinc oxide nanowires.

(g) Comparative Data Analysis of Device Architectures

Figure 10:
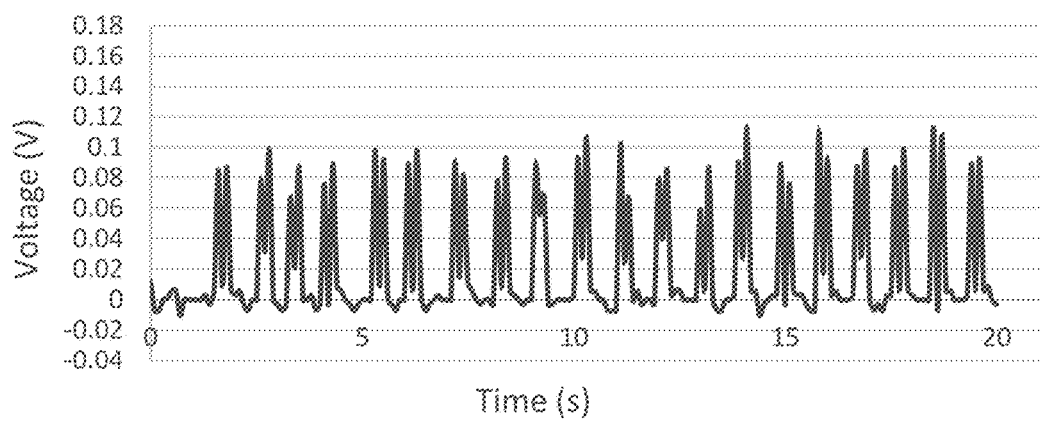
FIG. 10 shows rectified voltages generated by cyclic compression of a non-optimized PNG fiber prepared with a gold seed layer.
Figure 11:
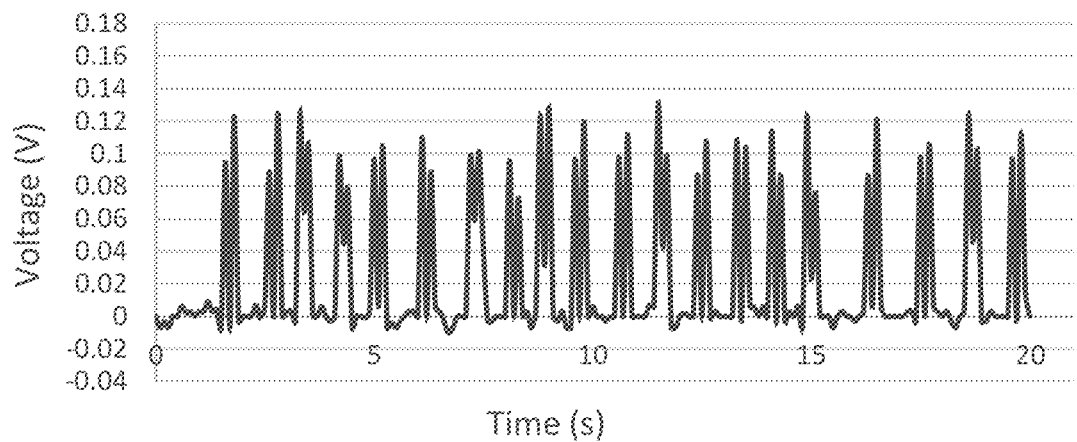
FIG. 11 shows rectified voltages generated by cyclic compression of a non-optimized PNG fiber prepared with a ZnO seed layer.
Figure 12:
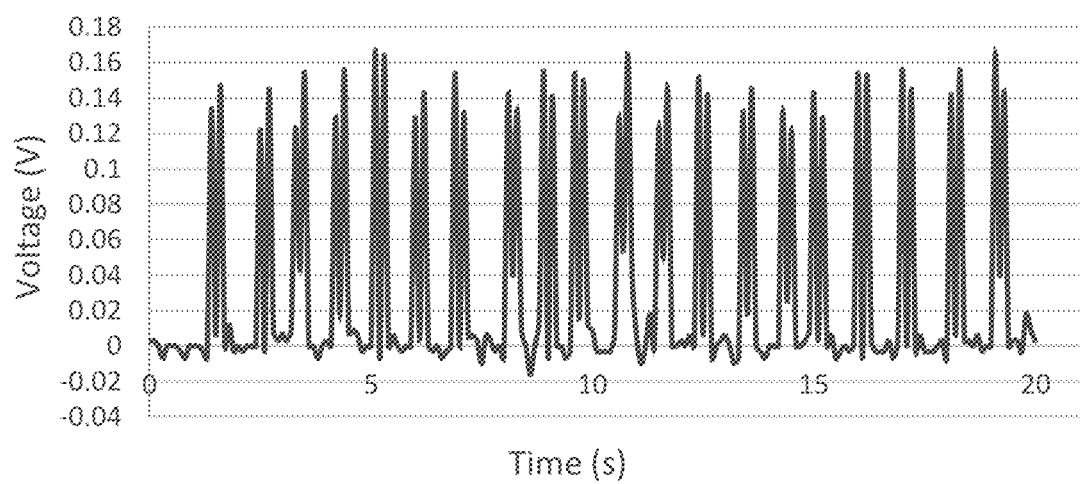
FIG. 12 shows rectified voltages generated by cyclic compression of an optimized PNG fiber.

With a voltage rectifier in the circuit, PNGs generated one positive voltage peak for every applied compression and another for every release in mechanical stress. Data were collected for the control devices constructed with a gold seed layer, 10 hours of nanowire growth, and a 75 μm PVDF layer, generating an average of 89.1 mV (FIG. 10.) Data were then taken for unoptimized devices constructed with a zinc oxide seed layer, 10 hours' nanowire growth, and a 75 μm PVDF layer, generating an average of 104.2 mV (FIG. 11). Finally, data were collected for optimized devices with a zinc oxide seed layer, 20 hours' nanowire growth, and a 50 μm PVDF layer, generating an average of 143.6 mV (FIG. 12).

2. Film-Type Organic Photovoltaic Cell (OPVC) Devices (a) Materials

Graphene oxide (GO) is an increasingly popular hole injection layer (HIL) and hole transport layer (HTL) for organic electronic applications, and it has recently been shown to be an efficient partner for PCDTBT:$PC_{70}BM$ (C.T.G. Smith et al., Appl. Phys. Lett. (2014) 105:073304-5.) Reduced graphene oxide (rGO) is useful as a transparent electrode and anode buffer layer. (H. P. Kim et al., *Solar Ener. Mat. & Solar Cells* (2013) 113:87-93.) Graphene oxide was synthesized from graphite flakes by Hummer's method (W. S. Hummer, R. E. Offeman, *J. Am. Chem. Soc.* (1958) 80:1339.) Reduced graphene oxide was prepared by borohydride reduction of GO. (H.-J. Shin et al., *Adv. Funct. Mater.* (2009) 19:1987-1992.)

Poly(3,4-ethylenedioxythiophene) poly(styrenesulfonate) (PEDOT:PSS) is a conductive polymer used as a hole transport layer (HTL) in organic electronic devices. The polymer is easily dispersed in aqueous solutions and therefore is ideal for a variety of deposition methods including drop-casting, spin coating, and inkjet-printing. The use of PEDOT:PSS layered onto GO or rGO as a hole extraction layer has been reported. (Y. Park et al., *Phys. Status Solidi A* (2012) 209:133-1368.)

Poly[N-9"-heptadecanyl-2,7-carbazole-alt-5,5-(4',7'-di-2-thienyl-2',1', 3'-benzothiadiazole (PCDTBT) is an electron-donating conductive polymer, and [6,6]-phenyl-$C_{70}$-butyric acid methyl ester ($PC_{70}BM$) is an electron-accepting conductive polymer. As a result of spontaneous phase separation in blends of these two polymers, charge-separating heterojunctions are formed throughout the bulk of the material; this is the basis of the bulk heterojunction (BHJ) solar cell architecture employing PCDTBT:$PC_{70}BM$ blends. (S.-H. Park et al., *Nature Photonics* (2009) 3:297-303.)

Silver nanoparticles were synthesized by the reduction of silver acetate with phenylhydrazine, in the presence of 1-dodecylamine as stabilizer. (Y. Li et al., *J. Am. Chem. Soc.* (2005) 127:3266-3267.) The nanoparticles were characterized by Energy Dispersive Spectroscopy (EDS) and SEM.

Titanium oxide polymer (TiOx) suspensions were conveniently synthesized by combining titanium tetra-isopropoxide (TTIP) (80 g) with 80 g of methanol, 16 g of glacial acetic acid, and 5 g of distilled water. (D. H. Wang et al., *J. Phys. Chem. C* (2009) 113:17268-17273.)

(b) Example of Device Fabrication

An Instras™ Spin-Coater (Instras Scientific, Ridgefield Park, N.J.) was employed for all spin-casting procedures. Silicon wafers were used as planar substrates for optimization experiments. PDMS substrates were fastened to spin-coating stages and rotated at designated velocities, while various suspensions were pipetted onto the spinning surfaces. The centrifugal force from the high-speed rotation uniformly disperses the suspensions on the substrate surface, forming the desired thin film layers. Wire substrates were attached to the stage in a radial orientation.

Polydimethylsiloxane (PDMS) prepolymer, with a base to cross-linker ratio of 10:1, was cast on the polished surface of a silicon wafer and cured for two hours at 80° C., forming an OPVC elastic substrate ca. 250 μm in thickness. The hydrophobic PDMS surface was modified by UV-ozone treatment for 10 minutes to provide a hydrophilic, wettable, and chemically reactive surface. (K. Efimenko et al., *J. Colloid Interface Sci.* (2002) 254:306-315.)

A 4 mg/ml suspension of GO was deposited on the modified PDMS surface and annealed at 125° C. After cooling for 30 minutes, a suspension of PEDOT:PSS in distilled water containing 1% fluorosurfactant (Zonyl® FS-300, DuPont, Wilmington Del.), and 5% DMSO was spin-coated at 3000 rpm for 60 seconds on the GO film, forming a 40 nm conductive anode layer. The PEDOT:PSS was annealed at 100° C. for 10 minutes to drive out residual moisture. PCDTBT:PC$_{70}$BM (1:4 mass ratio) was dissolved in a mixture of ortho-dichlorobenzene and chlorobenzene (3:1 volumetric ratio), with 1 wt % silver nanoparticles added. This mixture was spin-coated on the PEDOT:PSS layer at 1250 rpm for 45 seconds, forming a 70 nm photoactive layer. The BHJ was subsequently dried at 70° C. for 10 minutes. After cooling, a TiOx preservative interlayer was spun over the BHJ at 3000 rpm and annealed at 150° C. for 10 minutes, forming a 20 nm protective film and completing the OPVC construction process.

To further augment OPVC device stability and performance, graphene-derived hole extraction layers (HELs) were employed to facilitate the transport of charge carriers through the PEDOT:PSS layer. Reduced graphene oxide (rGO) films were effectively formed by the reduction of GO intermediate films with aqueous sodium borohydride. (H.-J. Shin et al., *Adv. Funct. Mater*. (2009) 19:1987-1992.)

(c) OPVC Device Characterization and Optimization

Figure 13:
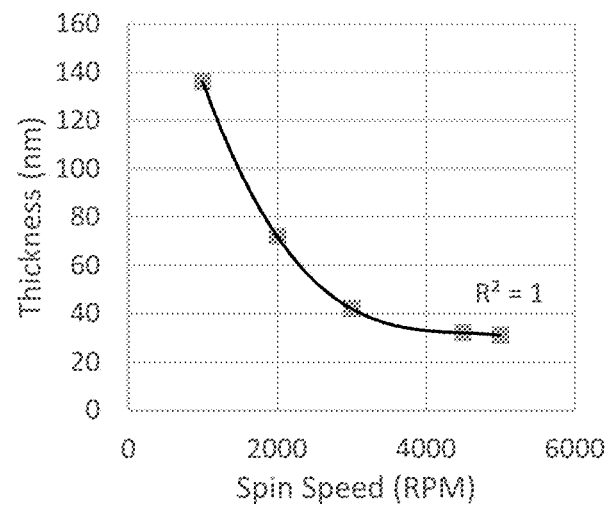
FIG. 13 shows the relationship between spin-coater rotational speed and the thickness of the PEDOT:PSS layer.
Figure 14:
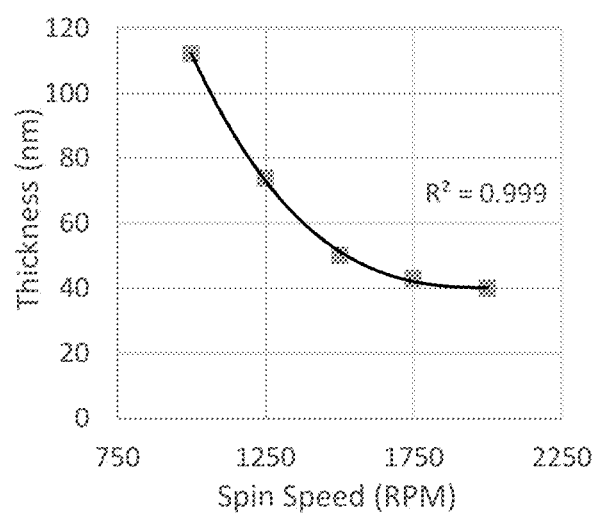
FIG. 14 shows the relationship between spin-coater rotational speed and the thickness of the PCDTBT:$PC_{70}BM$ layer.
Figure 15:
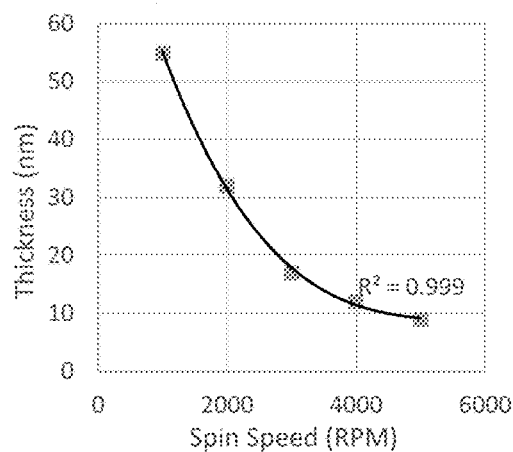
FIG. 15 shows the relationship between spin-coater rotational speed and the thickness of the TiOx layer.

Spectral Reflectance was employed for measurements from which polynomial trend lines were generated to correlate rotational spin speeds (rpm) with thin film thicknesses. Thicknesses of the PEDOT:PSS, PCDTBT:PC$_{70}$BM (FIG. 13) and TiOx layers (FIG. 14) were determined through Multiple Interface Spectral Reflectance, where the reflectance of light off the top and bottom layers of a thin film equates to a thickness measurement. PDMS substrate thicknesses (FIG. 15) were determined through Single Interface Spectral Reflectance, where the fraction of light that is reflected by a material's surface is correlated to a thickness reading.

Figure 16:
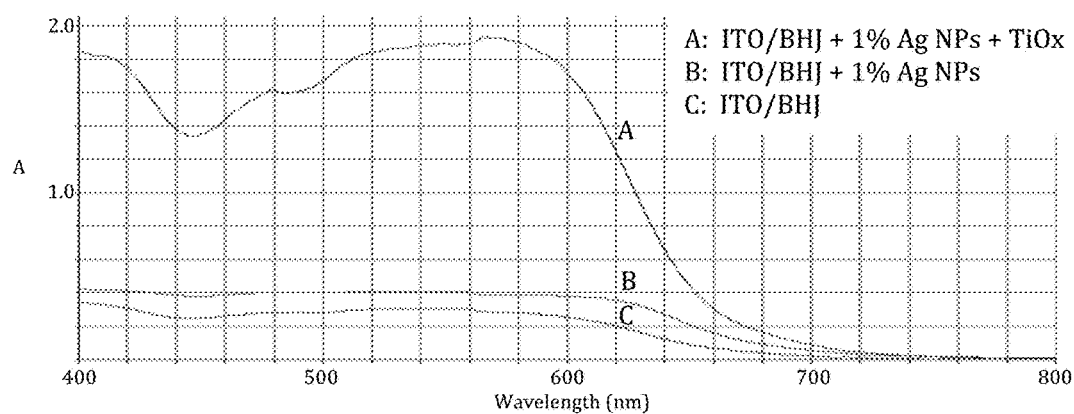
FIG. 16 shows the UV-visible absorbance of bulk heterojunction (BHJ) layers with and without silver nanoparticles and a TiOx interlayer.

A preservative TiOx interlayer additionally supplemented OPVC device stability and performance. Attenuated Total Reflectance Fourier Transform Infrared Spectroscopy (ATR-FTIR) verified the successful synthesis and isolation of GO and TiOx reaction products. The OPVC BHJ active layer was enhanced by the integration of silver nanoparticles, augmenting solar cell absorbance and improving OPVC efficiency by the plasmonic reflection and scattering of incident light. (D. H. Wang et al., *Adv. Energy Mater*. (2011) 1:766-770.) UV-Visible spectroscopy, using a PerkinElmer™ integrating sphere, was used to quantify improvements in spectral absorbance, as OPVCs prepared on an ITO-coated glass substrate were supplemented with silver nanoparticles ("Ag NPs") and TiOx (FIG. 16.)

Figure 17:
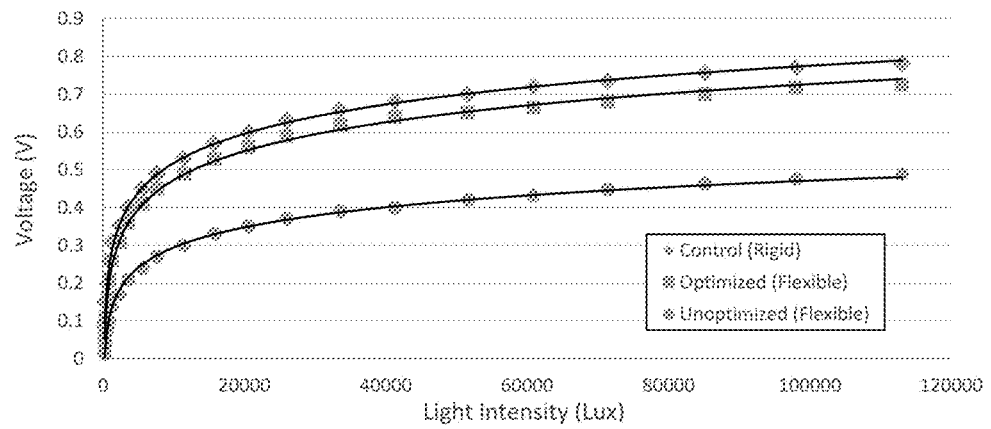
FIG. 17 shows voltage as a function of light intensity for rigid (ITO-coated glass), unoptimized flexible, and optimized flexible OPVC structures.
Figure 18:
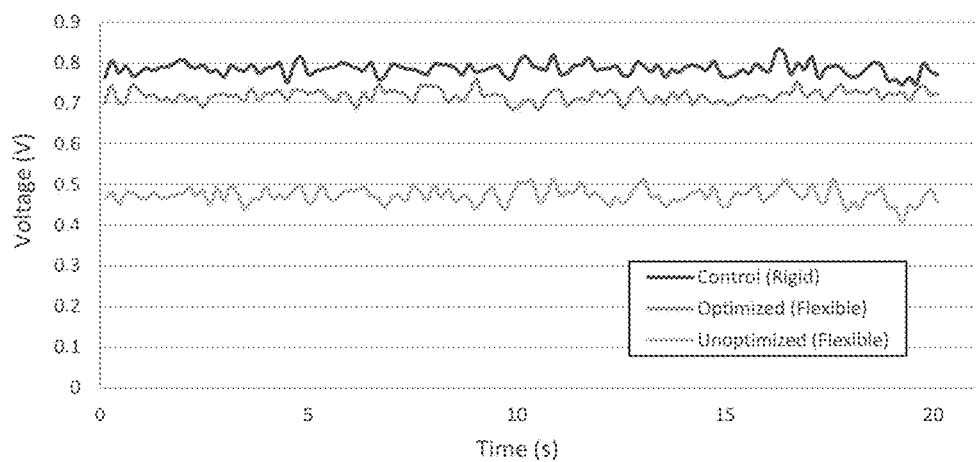
FIG. 18 shows voltage as a function of time for rigid (ITO-coated glass), unoptimized flexible, and optimized flexible OPVC structures under constant irradiation.

Solar cell measurements were conducted on a Newport optical bench (Newport Corp., Irvine Calif.) under various light intensities using EGaIn liquid metal top contacts on the PEDOT:PSS and PCDTBT:PC$_{70}$BM layers. Prior to data collection, the optical bench was calibrated to relate the voltage applied to the halogen lamp to the lux intensity incident upon the OPVC devices. Solar cell outputs were then measured as a function of light intensity (FIG. 17.) The OPVC voltage outputs were also measured over a 20 second period to observe relative consistency and short-term variability in device performance (FIG. 18.)

Current density-voltage (J-V) characteristics were obtained for various OPVC device architectures under a simulated solar irradiance of 100 mW/cm$^2$ at standard atmosphere conditions. A selection of potentiometers supplied the variable resistance necessary for generating I-V and J-V traces. Organic solar cell voltage was measured as a function of incident light intensity to compare rigid (control), unoptimized flexible, and optimized flexible device architectures.

(d) PDMS Substrate Thickness

Figure 19:
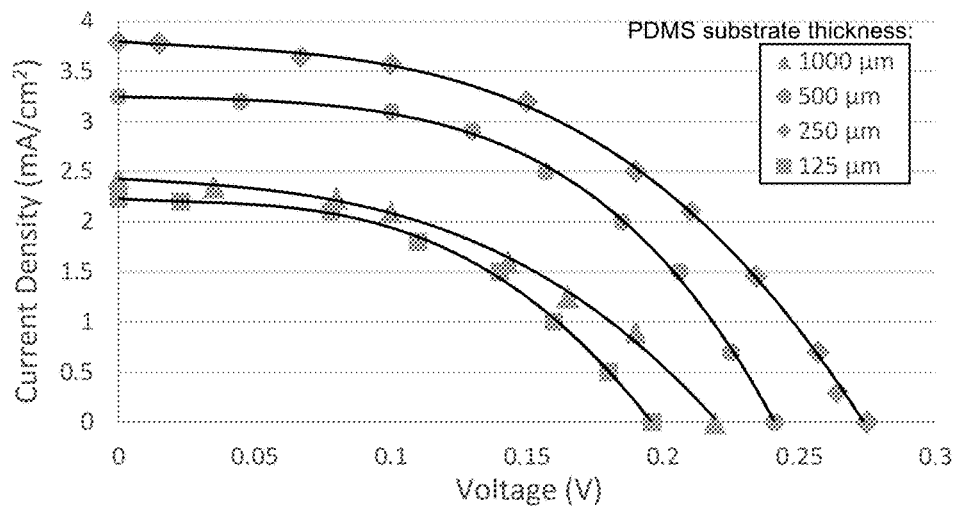
FIG. 19 shows current density at various generated voltages, for OPVC structures having a variety of PDMS layer thicknesses.

Various OPVC device architectures, 100 mm$^2$ in active layer surface area, were constructed and compared under a solar simulator of 100 mW/cm$^2$ irradiance intensity. The voltage and current density outputs of each OPVC architecture were then measured and recorded to generate the corresponding J-V curves. Organic solar cells constructed on PDMS substrates of varied thicknesses were evaluated for power conversion efficiency (PCE). PDMS substrates 250 μm in thickness exhibited the greatest PCE (FIG. 19).

(e) Duration of UV-Ozone Surface Activation

Figure 20:
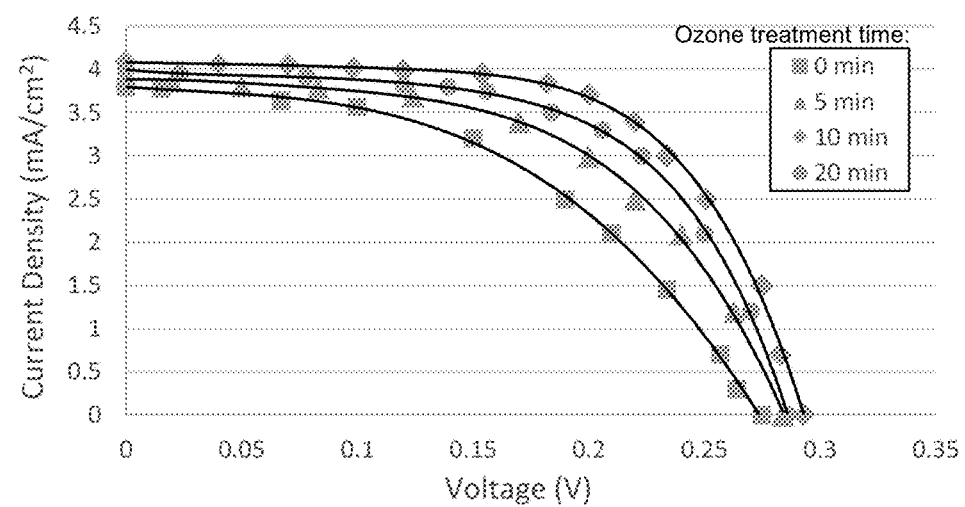
FIG. 20 shows current density at various generated voltages, for OPVC structures having a variety of PDMS layer ozone treatment times.

Cells constructed on PDMS substrates with varied durations of UV-ozone treatment were compared. The premise of UV-ozone treatment is to decrease the surface hydrophobicity of PDMS via oxidation with photochemically generated atomic oxygen. UV wavelengths of 185 nm produce ozone from diatomic oxygen, while wavelengths of 254 nm convert ozone to atomic oxygen. The reactive species produced by UV-ozone surface activation attack the siloxane backbone of PDMS, forming hydrophilic SiO and Si—OH. OPVCs fabricated on PDMS substrates with 10 minutes of UV-ozone surface activation exhibited the highest PCE (FIG. 20). OPVCs given more than 10 minutes of UV-ozone treatment exhibited degradation and hardening of the PDMS surface layer, and provided lower PCEs.

(f) PEDOT:PSS Layer Thickness

Figure 21:
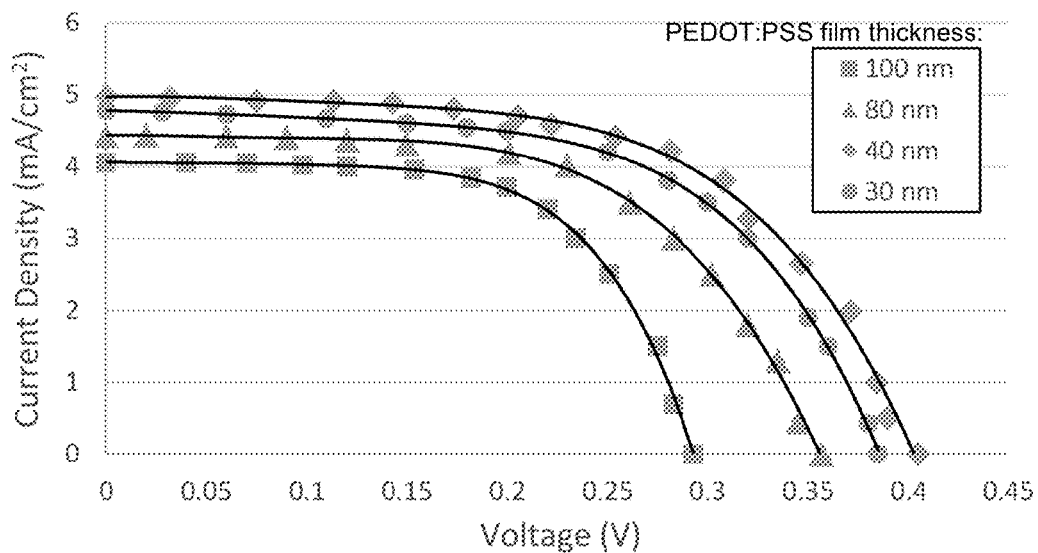
FIG. 21 shows current density at various generated voltages, for OPVC structures having a variety of PEDOT:PSS layer thicknesses.

Thickness of the PEDOT:PSS transparent anode layer, as measured by Spectral Reflectance, was varied in device architectures. Films less than 40 nm in thickness exhibited lower PCEs, presumably due to an increase in anode layer defects (FIG. 21). Sheet resistance was highest for 100 nm PEDOT:PSS thin films. In these experiments, 40 nm films exhibited the lowest resistance and produced the highest PCE in solar cells.

(g) PCDTBT:PC$_{70}$BM Photoactive Layer Thickness

Figure 22:
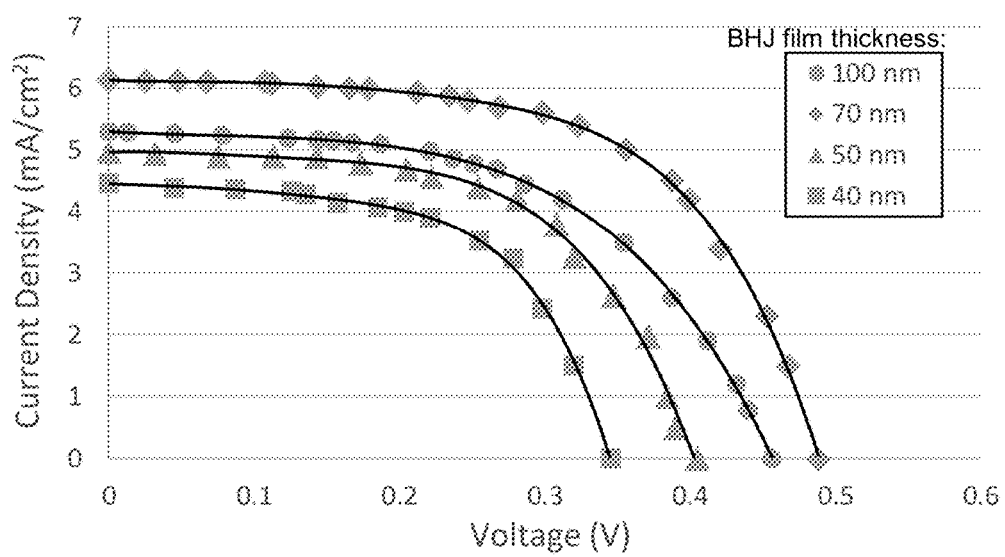
FIG. 22 shows current density at various generated voltages, for OPVC structures having a variety of BHJ layer thicknesses.

Organic solar cells of varying PCDTBT:PC$_{70}$BM active layer thicknesses, as measured by spectral reflectance, were also compared. Those constructed with a 70 nm BHJ active layer produced optimal results (FIG. 22). The active layer in organic solar cells is responsible for charge generation, separation, transport, and collection. During these processes, photo-generated carriers compete with charge recombination from the instant of exciton formation to charge collection at opposite electrodes. PCEs of organic solar cells are significantly enhanced by limiting recombination prior to charge collection. Thinner BHJ layers decrease the likelihood of recombination, but because thinner layers exhibit lower net absorbance of light, a balance must be struck. For the OPVCs constructed in these experiments, performance was optimum with a BHJ film thickness of 70 nm.

(h) Graphene-Derived Hole Extraction Layers

Figure 23:
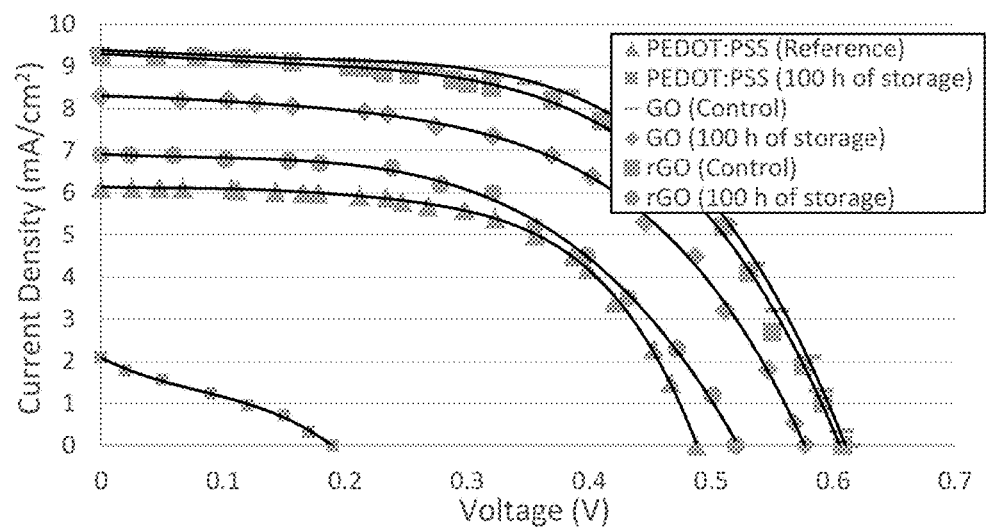
FIG. 23 shows current density at various generated voltages, for OPVC structures having fresh and aged PEDOT:PSS films, with and without a graphene oxide or reduced graphene oxide layer.

The application of graphene-derived HELs beneath the PEDOT:PSS anode layer was investigated. GO and rGO HELs exhibited comparable PCEs in newly cast OPVCs; however, a GO-HEL structure substantially improved device stability in comparison to that of cells fabricated with rGO or without a HEL (FIG. 23). GO, being an insulator, serves as an effective hole transport layer while inhibiting electron transport; this property decrease the probability of charge carrier recombination and normally leads to higher PCEs in solar cells. Additionally, the morphological and chemical stability of GO makes it an excellent HEL for application beneath the chemically unstable, hygroscopic PEDOT:PSS hole transport layer. OPVCs constructed solely with PEDOT:PSS exhibit complete degradation in PCE after 100 hours of storage in air and darkness, illustrating the value of graphene-derived HELs.

(i) Silver Nanoparticle Plasmon Enhancement of PCDTBT:PC$_{70}$BM

Figure 24:
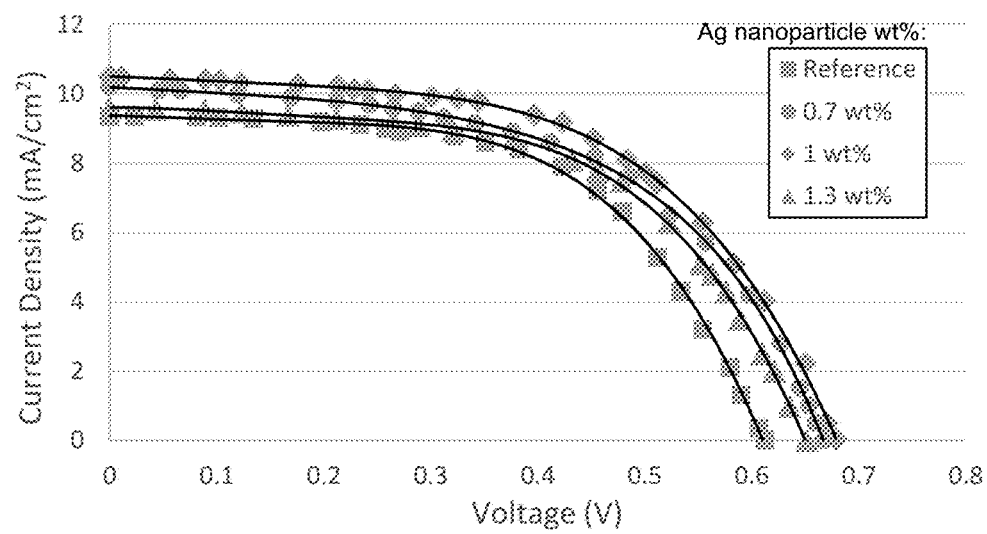
FIG. 24 shows current density at various generated voltages, for OPVC structures having varying levels of silver nanoparticles in the BHJ layer.

The effect of varying the quantity of silver nanoparticles integrated within the BHJ active layer was investigated. Cells with 1 wt % silver nanoparticles exhibited the greatest PCE as a result of enhanced solar cell absorbance (FIG. 24). The embedded metal nanoparticles were capable of reflecting and scattering incident light, thereby prolonging the optical path length of photons through the BHJ active layer, promoting exciton formation and charge separation. The integration of silver nanoparticles also decreased active layer resistance, resulting in further PCE enhancement.

(j) Application of Polymeric TiOx

Figure 25:
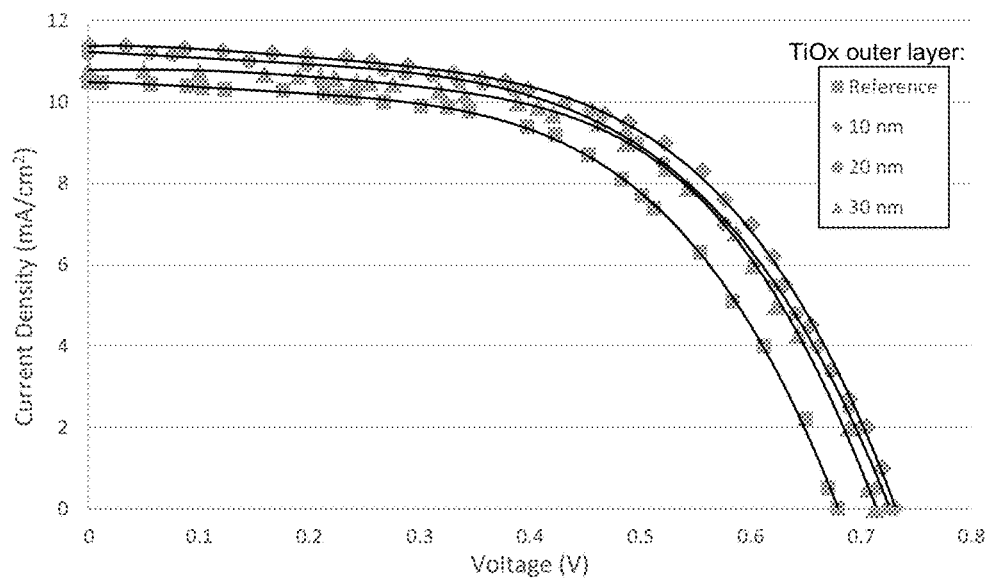
FIG. 25 shows current density at various generated voltages, for OPVC structures having TiOx interlayers of varying thickness.
Figure 26:
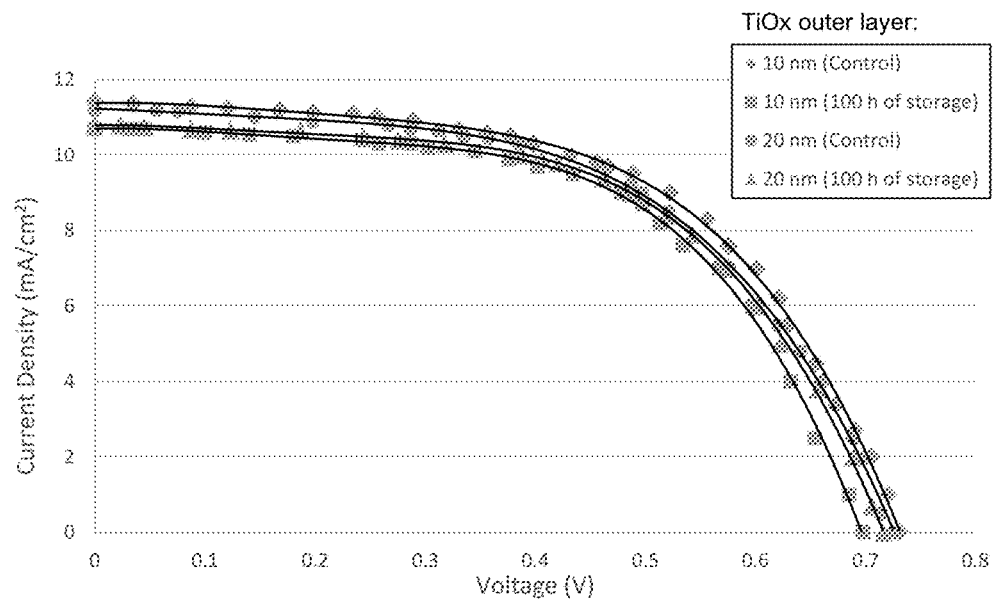
FIG. 26 shows current density at various generated voltages, for fresh and aged OPVC structures having 10 nm and 20 nm TiOx interlayers.

The presence and thickness of the TiOx interlayer was varied in OPVC device architectures. Although solar cells were comparable in efficiency, thinner films exhibited higher PCEs (FIG. 25). On the other hand, cells with 20 nm TiOx films exhibited the greatest improvement in device stability (FIG. 26). A chemically stable TiOx preservative interlayer, as an optical spacer and hole blocking layer, also enhanced light absorption, charge collection at opposite electrodes, and device stability.

(k) Comparative Data Analysis of OPVC Device Architectures

The above experiments led to the selection of an optimized flexible OPVC architecture with the following structural distinctions: a PDMS substrate 250 μm in thickness, UV-ozone PDMS surface activation for 10 minutes, a GO HEL for efficiency and device stability, a PEDOT:PSS transparent conducting anode 40 nm in thickness, a 70 nm PCDTBT:PC$_{70}$BM BHJ photoactive layer with 1 wt % silver nanoparticles, and a TiOx preservative interlayer 20 nm in thickness for efficiency and device stability. This optimized flexible solar cell generated comparable voltages to those of rigid solar cells constructed on ITO-coated glass substrates, and significantly outperformed its unoptimized counterparts in both efficiency and stability (FIGS. 17-18.)

3. Filamentous OPV-PNG Devices (a) Device Construction

PDMS solar cell base layers, ca. 250 μm in thickness, were dip-coated on the exterior of intermediate PNG filaments and solidified at 80° C. for 2 hours in an isothermal oven. After 10 minutes of UV-ozone surface activation, a graphene oxide HEL was deposited from a 4 mg/mL suspension of GO onto the cured PDMS insulator, and annealed at 125° C. After cooling, intermediate filaments were dip-coated in a PEDOT:PSS suspension, fastened to the spin-coating stage with adhesive tape in a radial orientation, and spun at 3000 rpm for 1 minute. The PEDOT:PSS layer was then annealed at 100° C. for 10 minutes and cooled for 20 minutes in air. These filaments were then dip-coated in a silver nanoparticle-enhanced PCDTBT:PC$_{70}$BM active layer solution prior to spinning at 1250 rpm for 45 seconds. The BHJ layer was subsequently dried at 70° C. for 10 minutes and cooled for 5 minutes. Finally, a polymeric TiOx preservative outer layer was applied by dip-coating, spun at 3000 rpm, and annealed at 150° C., completing the OPV-PNG construction process.

(b) Device Characterization and Methods for Stability Enhancement

OPV-PNG stability was enhanced by encapsulating devices within a thin PDMS preservative coating. UV-Visible spectroscopy was employed to determine the transmittance of PDMS films at various wavelengths, and indicated ~97% transmittance of visible wavelengths and ~81% transmittance of ultraviolet wavelengths. PDMS was selected for device encapsulation due to its characteristic properties of high thermal stability, chemical resistivity, and hydrophobicity, enabling OPV-PNG devices to maintain efficiency while exposed to atmospheric moisture. After OPV-PNGs were dipped in uncured PDMS, the filaments were spun at 1000 rpm for 5 seconds, producing uniformly thin PDMS preservative coatings. Devices were then immediately transferred to an isothermal oven at 80° C. for 45 minutes to cure the deposited PDMS coatings.

OPV-PNG filaments were subject to 240 hours of storage in air and darkness between voltage readings. OPV-PNG solar cell performance was quantified on the Newport optical bench. EGaIn liquid metal contacts were employed to conduct voltage and current measurements of the devices. Control devices, without PDMS thin film coatings, were then compared in efficiency and stability to encapsulated ones under 100 mW/cm2 irradiance. OPV-PNG piezoelectric performance was measured between 1"×1" glass slides with a force sensor and full-wave voltage rectifier. To quantify piezoelectric outputs, a repetitive force of 20 N was applied for a duration of 20 seconds on the glass sides.

Two OPV-PNG filaments were integrated within a cotton fabric to simulate a practical application. Interwoven copper filaments were employed as conductive bridges. Devices were seamlessly integrated, permitting uninhibited flexibility of fabrics. For data collection, integrated textiles were positioned between two 5"×5" glass slides on which a repetitive downward force was applied on the top slide while 100 mW/cm2 light irradiation was supplied on the bottom. Real-time data of the dual filamentous OPVCs and dual PNG cores was collected simultaneously by two separate voltage sensors so as to identifiably demonstrate piezoelectric responses, without being obscured by variations in solar cell output voltage.

(c) OPV-PNG Filament Photovoltaic Performance Over Time

Figure 27:
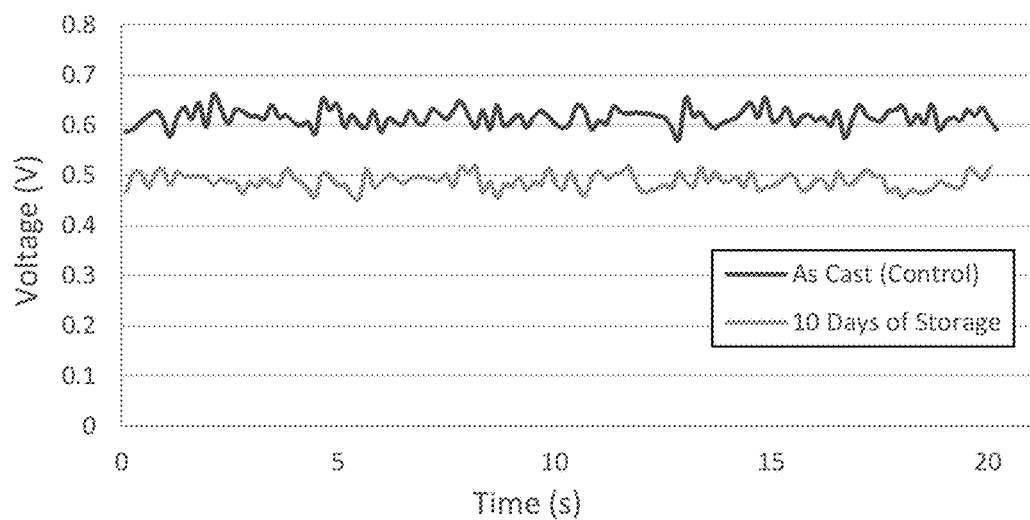
FIG. 27 shows voltage as a function of time for a hybrid device of the invention having a TiOx outer layer, as cast and after 10 days' storage.
Figure 28:
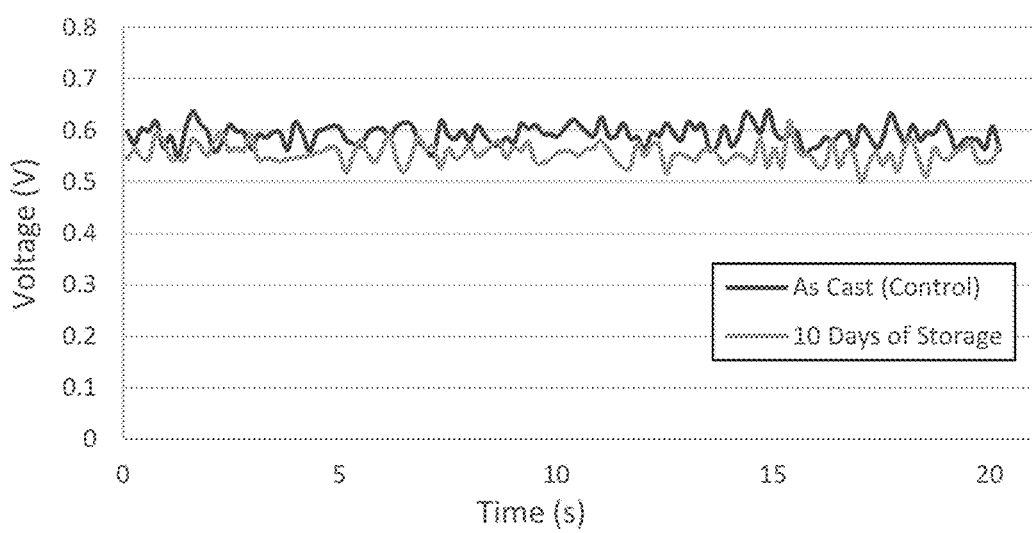
FIG. 28 shows voltage as a function of time for a hybrid device of the invention having a PDMS outer coating, as cast and after 10 days' storage.

Experimental devices were subject to approximately 240 hours of storage, in air and darkness, between voltage readings. TiO$_x$ coated filamentous OPVCs exhibited a 30% decrease in voltage (FIG. 27). This decrease in performance may be attributed to an escalated vulnerability to the diffusion of atmospheric water and oxygen into the OPVC device. Hygroscopic PEDOT:PSS absorbs water from the air increasing sheet resistance and diminishing solar cell output, and active layer polymers may chemically degrade by spontaneous or photocatalyzed oxidation. Solar cells encapsulated in PDMS exhibited only a 0-6% decrease in output voltage after storage (FIG. 28).

(d) Performance of Filamentous PNG Cores Over Time

PNG cores exhibited an insignificant loss in voltage output after storage for 10 days. This finding suggested a high preservation of β-phase PVDF content despite the lack of high-voltage poling prior to device fabrication. The results may also be attributed to the inherent stability of zinc oxide and PVDF as materials. Slight decreases in piezoelectric voltage in the completed hybrid devices may be due to the cushioning effect of the PDMS and OPVC layers surrounding the PNG cores.

(e) Performance of OPV-PNG Integrated Cotton Textile

Figure 29:
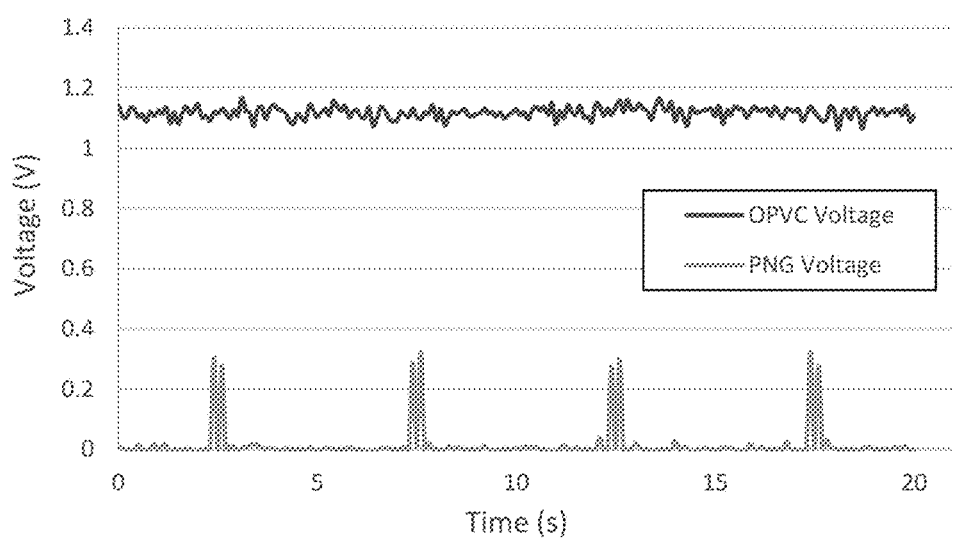
FIG. 29 Shows voltages generated from the piezoelectric and photovoltaic components of a hybrid device integrated into cotton fabric.

Two filamentous hybrid OPV-PNG devices were interwoven into cotton fabric swatches to simulate a practical application. Interwoven copper filaments were employed as conductive bridges allowing for uninhibited flexibility and stretchability of the textiles. The OPVC components generated 1.14 V under an irradiance intensity of 100 mW/cm2, while the PNG cores consistently generated 310 mV under 20 N of applied downward force (FIG. 29.)

The examples and associated figures provided herein are not limiting, but rather are intended to provide examples of representative embodiments of the invention. Modifications and substitutions to the described invention will be evident to those skilled in the art, and such modifications are intended to be within the scope of the invention.

I claim:

1. A hybrid piezoelectric-photovoltaic fiber, comprising:
   (a) a metallic wire core having a surface;
   (b) a plurality of piezoelectric nanowires attached to the surface of the wire core;
   (c) a piezoelectric polymer sheath enclosing the wire core and having the piezoelectric nanowires embedded within; and
   (d) a photoelectric sheath enclosing the piezoelectric polymer sheath.

2. The hybrid piezoelectric-photovoltaic fiber according to claim 1, wherein the metallic wire core is a copper or silver wire.

3. The hybrid piezoelectric-photovoltaic fiber according to claim 1, wherein the piezoelectric polymer sheath comprises β-phase polyvinylidine difluoride.

4. The hybrid piezoelectric-photovoltaic fiber according to claim 1, wherein the photoelectric sheath comprises concentric layers of
   (a) an elastomer base layer;
   (b) a hole transport layer; and
   (c) a photoelectric layer.

5. The hybrid piezoelectric-photovoltaic fiber according to claim 4, wherein the elastomer base layer comprises polydimethylsiloxane.

6. The hybrid piezoelectric-photovoltaic fiber according to claim 4, wherein the hole transport layer comprises PEDOT:PSS.

7. The hybrid piezoelectric-photovoltaic fiber according to claim 4, wherein the photoelectric layer is a bulk heterojunction.

8. The hybrid piezoelectric-photovoltaic fiber according to claim 7, wherein the bulk heterojunction is PCDTBT:$PC_{70}BM$.

9. The hybrid piezoelectric-photovoltaic fiber according to claim 8, wherein the bulk heterojunction further comprises silver nanoparticles.

10. The hybrid piezoelectric-photovoltaic fiber according to claim 4, wherein the photoelectric sheath further comprises a hole extraction layer.

11. The hybrid piezoelectric-photovoltaic fiber according to claim 10, wherein the hole extraction layer comprises graphene oxide.

12. The hybrid piezoelectric-photovoltaic fiber according to claim 4, wherein the photoelectric sheath further comprises a TiOx protective layer.

13. The hybrid piezoelectric-photovoltaic fiber according to claim 4, wherein
   (a) the elastomer base layer comprises polydimethylsiloxane;
   (b) the hole transport layer comprises PEDOT:PSS; and
   (c) the photoelectric layer is a PCDTBT:$PC_{70}BM$ heterojunction.

14. The hybrid piezoelectric-photovoltaic fiber according to claim 13, wherein the bulk heterojunction further comprises silver nanoparticles.

15. The hybrid piezoelectric-photovoltaic fiber according to claim 13, wherein the photoelectric sheath further comprises a hole extraction layer.

16. The hybrid piezoelectric-photovoltaic fiber according to claim 15, wherein the hole extraction layer comprises graphene oxide.

17. The hybrid piezoelectric-photovoltaic fiber according to claim 13, wherein the photoelectric sheath further comprises a TiOx protective layer.

18. The hybrid piezoelectric-photovoltaic fiber according to claim 13, wherein
   (a) the bulk heterojunction further comprises silver nanoparticles;
   (b) the photoelectric sheath further comprises a hole extraction layer; and
   (c) the photoelectric sheath further comprises a TiOx protective layer.

19. The hybrid piezoelectric-photovoltaic fiber according to claim 18, wherein the hole extraction layer comprises graphene oxide.

20. The hybrid piezoelectric-photovoltaic fiber according to claim 13, wherein the piezoelectric polymer sheath comprises β-phase polyvinylidine difluoride.

* * * * *